United States Patent [19]
Fujii

[11] Patent Number: 6,091,277
[45] Date of Patent: Jul. 18, 2000

[54] INPUT BUFFER CIRCUIT FOR SEMICONDUCTOR IC CIRCUIT

[75] Inventor: Toru Fujii, Tokyo, Japan

[73] Assignee: NEC Corporation, Toyko, Japan

[21] Appl. No.: 09/233,128

[22] Filed: Jan. 19, 1999

[30] Foreign Application Priority Data

Jan. 19, 1998 [JP] Japan .................................. 10-008044

[51] Int. Cl.[7] .......................... H03K 17/62; H03K 17/693
[52] U.S. Cl. ............................................ 327/407; 327/403
[58] Field of Search ........................ 326/16, 83; 327/403, 327/404, 405, 407, 408, 411, 334, 108

[56] References Cited

U.S. PATENT DOCUMENTS 5,617,044  4/1997  Takamoto ................................. 327/403
5,828,236  10/1998  Zhou ........................................ 326/83

*Primary Examiner*—Toan Tran
*Assistant Examiner*—Paul Dinh

*Attorney, Agent, or Firm*—Sughrue, Mion, Zinn Macpeak & Seas, PLLC

[57] ABSTRACT

Disclosed is an input buffer circuit for semiconductor integrated circuit which has: a differential amplification circuit to amplify an input signal; a current cutting-off circuit which cuts off the short-circuit current of the differential amplification circuit when a test enable signal supplied from the outside is in on-state; and a selection means which selects the output of the differential amplification circuit when the test enable signal is in off-state and outputs selecting the input signal when the test enable signal is in on-state. Optionally, the input buffer circuit further has: a control circuit which controls the differential amplification circuit and the selection circuit so that the test enable signal is made valid when an input enable signal supplied from the outside is in on-state, and the short-circuit current of the differential amplification circuit is cut off and a signal with a given level is output to the next stage when the input enable signal is in off-state.

2 Claims, 3 Drawing Sheets

| IN | REF | TIB | OUT | REMARKS |
|---|---|---|---|---|
| 1 | $V_{REF}$ | 0 | 1 | NORMAL OPERATION MODE (WITH SHORT-CIRCUIT CURRENT) |
| 0 | $V_{REF}$ | 0 | 0 | |
| 1 | X | 1 | 1 | IDDQ TEST MODE (WITHOUT SHORT-CIRCUIT CURRENT) |
| 0 | X | 1 | 0 | FULL-SWING INPUT TO 'IN' |

| IN | REF | NIB | TIB | OUT | REMARKS |
|---|---|---|---|---|---|
| 1 | $V_{REF}$ | 1 | 0 | 1 | NORMAL OPERATION MODE (WITH SHORT-CIRCUIT CURRENT) |
| 0 | $V_{REF}$ | 1 | 0 | 0 | |
| 1 | X | 1 | 1 | 1 | IDDQ TEST MODE (WITHOUT SHORT-CIRCUIT CURRENT) |
| 0 | X | 1 | 1 | OUT | FULL-SWING INPUT TO 'IN' |
| X | X | 0 | X | 1 | INPUT DISENABLE (WITHOUT SHORT-CIRCUIT CURRENT) |

INPUT BUFFER CIRCUIT FOR SEMICONDUCTOR IC CIRCUIT

FIELD OF THE INVENTION

This invention relates to an input buffer circuit that is provided for input section of LSI (large-scale integrated circuit)

BACKGROUND OF THE INVENTION

Recently, high-speed input-output buffer has been required as high-speed LSI is developed. Such a high-speed input-output buffer is realized by lowering the amplitude of signal. Especially, for input buffer, differential circuit is frequently used to obtain noise margin. On the other hand, IDDQ test to check the leakage current of LSI is a useful method for LST test, and is increasingly in demand.

Conventionally, for LSI which uses a differential circuit where the short-circuit current cannot be cut off, the IDDQ test is conducted adding part of short-circuit current. However, since the part of short-circuit current is significantly greater than the leakage current to flow in case of fault, there is a problem that it is difficult to know which the current measured is leakage current or short-circuit current. Also, when the short-circuit current is cut off by stopping the operation of differential circuit using input enable terminal, it is difficult to give a test pattern with high fault coverage for LSI internal circuit, since the logic output from input buffer circuit is fixed.

SUMMARY OF THE INVENTION

Accordingly, it is an object of the invention to provide an input buffer circuit for semiconductor integrated circuit where a test pattern with high fault coverage can be given even when short-circuit current is cut off in IDDQ test.

According to the invention, an input buffer circuit for semiconductor integrated circuit, comprises:

- a differential amplification circuit to amplify an input signal;
- a current cutting-off circuit which cuts off the short-circuit current of the differential amplification circuit when a test enable signal supplied from the outside is in on-state; and
- a selection means which selects the output of the differential amplification circuit when the test enable signal is in off-state and outputs selecting the input signal when the test enable signal is in on-state.

According to another aspect of the invention, an input buffer circuit for semiconductor integrated circuit, comprises:

- a differential amplification circuit to amplify an input signal;
- a current cutting-off circuit which cuts off the short-circuit current of the differential amplification circuit when a test enable signal supplied from the outside is in on-state;
- a selection means which selects the output of the differential amplification circuit when the test enable signal is in off-state and outputs selecting the input signal when the test enable signal is in on-state.
- a control circuit which controls the differential amplification circuit and the selection circuit so that the test enable signal is made valid when an input enable signal supplied from the outside is in on-state, and the short-circuit current of the differential amplification circuit is cut off and a signal with a given level is output to the next stage when the input enable signal is in off-state.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
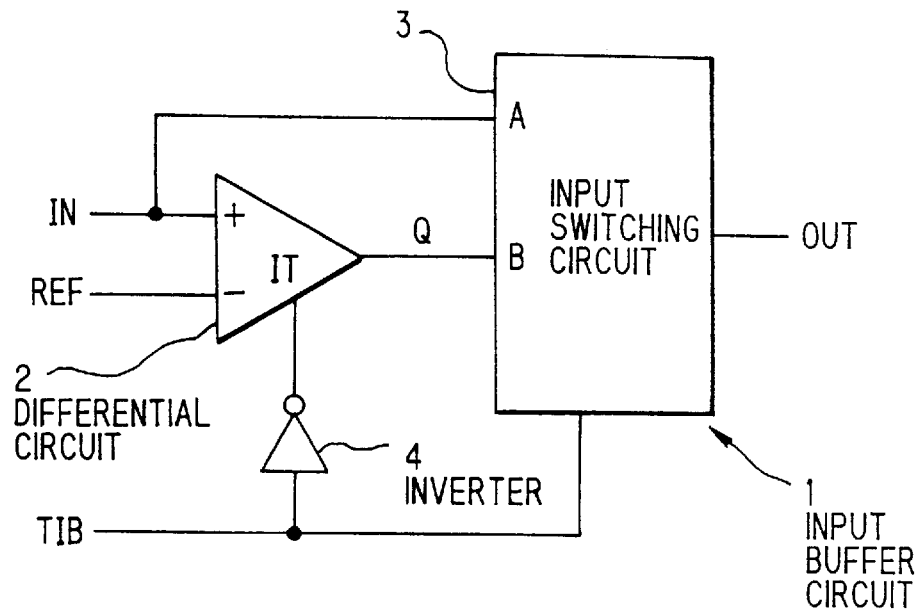
FIG. 1 is a block diagram showing the composition of a first preferred embodiment according to the invention.

The first preferred embodiment of the invention is explained below, referring to the drawings. FIG. 1 is a block diagram showing the composition of the first embodiment. This input buffer circuit 1 is composed of a differential circuit 2, an input switching circuit 3 and an inverter 4.

Figure 2:
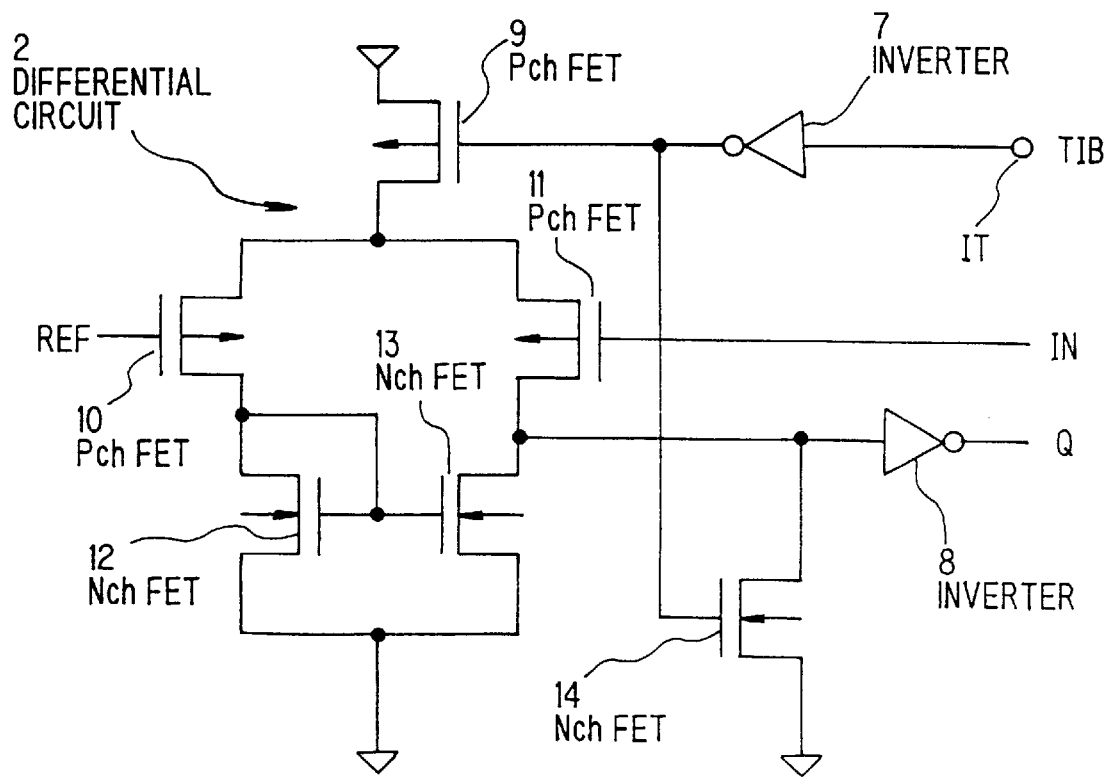
FIG. 2 is a circuit diagram showing the details of a differential circuit 2 in FIG. 1.

The differential circuit 2 is a differential circuit with an enable terminal IT, and can be switched into normal operation or output-fixed state (cutting-off of short-circuit current) by a test enable signal TIB. FIG. 2 is a circuit diagram showing the details of the differential circuit 2. In FIG. 2, 7 and 8 are inverters, 9, 10 and 11 are P-channel FET (field-effect transistor), and 12, 13 and 14 are N-channel FET. In the differential circuit 2, the output of the inverter 7 becomes "L (low)" level when the test enable signal TIB is at "H (high)" level, thereby FET 9 is turned ON. As a result, it comes into normal differential operation, where the short-circuit current flows. On the other hand, FET 9 is cut off when the test enable signal TIB is at "L" level, therefore the power supply is cut off and the short-circuit current is cut off. At the same time, N-channel FET 14 is turned ON, therefore the input end of the inverter 8 becomes "L" level and the output of the inverter 8, i.e. output signal Q, is fixed at "H" level.

Figures 3, 4:
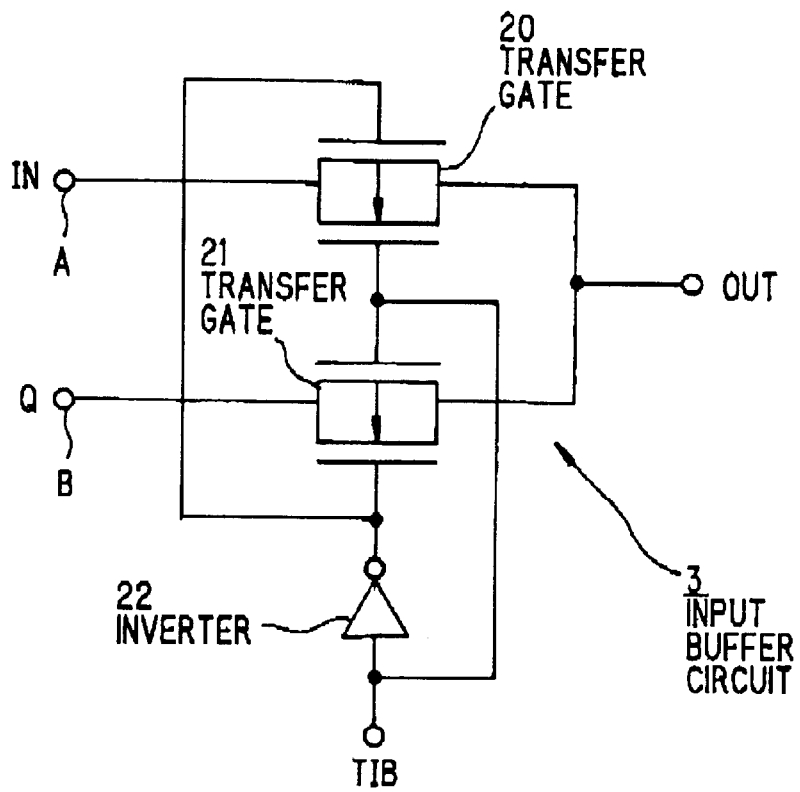
FIG. 3 is a circuit diagram showing the details of an input switching circuit 3 in FIG. 1.
FIG. 4 is a table showing the relationships among input and output signals in the circuit in FIG. 1.

The input switching circuit 3 can output selecting a signal from terminal A and terminal B by input selection signal. FIG. 3 is a circuit diagram showing the details of the input switching circuit 3, which is composed of transfer gates 20, 21 and an inverter 22.

When the test enable signal TIB is at "H" level, the transfer gate 20 is turned ON, a signal from terminal A, i.e. input signal IN, is output as output signal OUT. Also, when the test enable signal TIB is at "L" level, the transfer gate 21 is turned ON, a signal from terminal B, i.e. output signal Q of the differential circuit 2, is output as output signal OUT.

Next, the operations of the input buffer circuit 1 are explained. First, when the test enable signal TIB is at "L" level, a signal at "H" level is input to the enable terminal IT of the differential circuit 2, thereby the differential circuit 2 operates as a normal differential circuit. Also, the transfer gate 20 of the input switching circuit 3 is turned OFF and 21 is turned ON, thereby output signal Q of the differential circuit 2 is output as output signal OUT. Namely, it comes into the normal operation mode.

In conducting the IDDQ test, the test enable signal TIB is made to be at "H" level. Thereby, "L" level is input to the enable terminal IT of the differential circuit 2, the differential circuit 2 comes into output-fixed state, where the short-circuit current is cut off. Also, the transfer gate 20 of the input switching circuit 3 is turned ON and 21 is turned OFF, input signal IN of the input buffer circuit 1 is output as output signal OUT. In this state, when full-swing input signal IN is input to the input terminal, the input buffer circuit 1 outputs the input signal IN, as it is, as output signal OUT while bypassing the differential circuit 2. Therefore, it is in the state that it functions as an input buffer. In addition, since the short-circuit current of the differential circuit 2 is thus cut off, the IDDQ test can be conducted (IDDQ test mode).

Also, regardless of normal operation mode/IDDQ test mode, this input buffer circuit 1 can always conduct the logic as a buffer circuit. Therefore, a normal pattern for function test can be used as an input pattern in conducting the IDDQ test. FIG. 4 shows the relationships among the above-mentioned signals. In FIG. 4, '$V_{REF}$' is a setting value for reference signal REF, and 'X' indicates that any signals do not concern other signals.

Figures 5, 6:
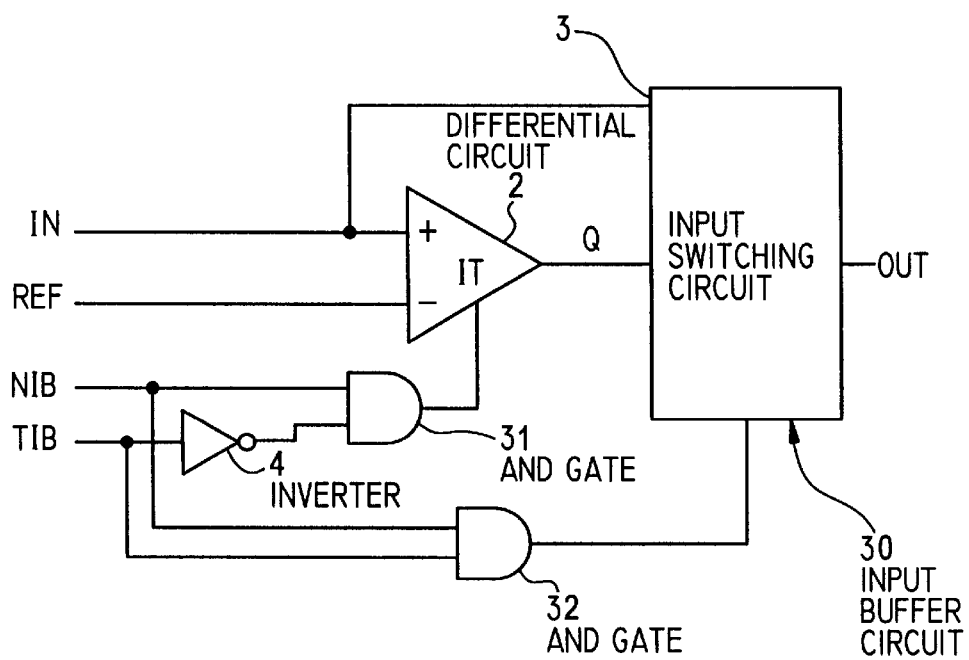
FIG. 5 is a block diagram showing the composition of a second preferred embodiment according to the invention.
FIG. 6 is a table showing the relationships among input and output signals in the circuit in FIG. 5.

Next, the second preferred embodiment of the invention is explained. FIG. 5 is a block diagram showing the composition of the second embodiment. The difference of a input buffer circuit 30 in FIG. 5 from the input buffer circuit 1 in FIG. 1 is that a terminal where input enable signal NIB is input and AND gates 31, 32 are provided.

In this composition, when input enable signal NIB is at "H" level, both the AND gates 31 and 32 are in open state, therefore the same operation as the input buffer circuit 1 in FIG. 1 is conducted. On the other hand, when input enable signal NIB is at "L" level, the output of the AND gate 31 becomes "L" level, thereby output signal Q of the differential circuit 2 is fixed at "H" level, where the short-circuit current is cut off. Also, since the output of the AND gate 32 becomes "L" level, output signal Q of the differential circuit 2 is output as output signal OUT through the input switching circuit 3. FIG. 6 shows the relationships among the above-mentioned input and output signals.

Advantages of the Invention:

Advantages obtained by this invention are as follows: In IDDQ test, since the short-circuit current of the differential circuit is cut off, the detection of leakage current to flow in LSI fault can be facilitated. Also, since it functions as an input buffer, the test can be conducted while giving a pattern with high fault coverage for LSI internal circuit. As a result, an accurate IDDQ test can be performed.

(2) By using a test signal terminal unused in normal use as the test enable terminal, the circuit designer can design it like the conventional circuit without changing normally-used terminals. Also, it can substitute for the conventional circuit. Therefore, compared with the conventional differential input circuit, it can be brought that, from the viewpoint of LSI circuit designer, no change of terminal and logic occur.

(3) By providing the same logic for both normal operation mode and IDDQ test mode, a pattern for normal function test can be diverted to this. Therefore, it is not necessary to newly make a special pattern for IDDQ test.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. An input buffer circuit for semiconductor integrated circuit, comprising:

a differential amplification circuit to amplify an input signal;

a current cutting-off circuit which cuts off the short-circuit current of said differential amplification circuit when a test enable signal supplied from the outside is in on-state; and a selection means which selects the output of said differential amplification circuit when said test enable signal is in off-state and outputs selecting said input signal when said test enable signal is in on-state.

2. An input buffer circuit for semiconductor integrated circuit, comprising:

a differential amplification circuit to amplify an input signal;

a current cutting-off circuit which cuts off the short-circuit current of said differential amplification circuit when a test enable signal supplied from the outside is in on-state;

a selection means which selects the output of said differential amplification circuit when said test enable signal is in off-state and outputs selecting said input signal when said test enable signal is in on-state a control circuit which controls said differential amplification circuit and said selection circuit so that said test enable signal is made valid when an input enable signal supplied from the outside is in on-state, and the short-circuit current of said differential amplification circuit is cut off and a signal with a given level is output to the next stage when said input enable signal is in off-state.

* * * * *